United States Patent
Lv

(10) Patent No.: US 11,839,098 B2
(45) Date of Patent: Dec. 5, 2023

(54) DISPLAY PANEL AND DISPLAY DEVICE INCLUDING CATHODE SET

(71) Applicant: Kunshan Go-Visionox Opto-Electronics Co., Ltd., Jiangsu (CN)

(72) Inventor: Lei Lv, Jiangsu (CN)

(73) Assignee: Kunshan Go-Visionox Opto-Electronics Co., Ltd., Kunshan (CN)

(*) Notice: Subject to any disclaimer, the term of this patent is extended or adjusted under 35 U.S.C. 154(b) by 281 days.

(21) Appl. No.: 17/315,244

(22) Filed: May 7, 2021

(65) Prior Publication Data

US 2021/0265587 A1    Aug. 26, 2021

Related U.S. Application Data

(63) Continuation of application No. PCT/CN2019/107918, filed on Sep. 25, 2019.

(30) Foreign Application Priority Data

Mar. 29, 2019   (CN) .......................... 201910252019.8

(51) Int. Cl.
*H10K 50/81* (2023.01)
*H10K 50/82* (2023.01)
(Continued)

(52) U.S. Cl.
CPC ......... *H10K 50/828* (2023.02); *H10K 50/818* (2023.02); *H10K 59/35* (2023.02);
(Continued)

(58) Field of Classification Search
CPC .... H10K 50/828; H10K 50/818; H10K 50/82; H10K 59/35; H10K 59/60; H10K 59/65;
(Continued)

(56) References Cited

U.S. PATENT DOCUMENTS

| | | | |
|---|---|---|---|
| 10,720,103 B2* | 7/2020 | Kim | H10K 59/123 |
| 2005/0186698 A1* | 8/2005 | Ishida | H10K 50/81 |
| | | | 438/99 |

(Continued)

FOREIGN PATENT DOCUMENTS

| | | |
|---|---|---|
| CN | 104201290 A | 12/2014 |
| CN | 105097877 A | 11/2015 |

(Continued)

OTHER PUBLICATIONS

Chinese First Office Action—100191 (CN-201910252019.8) with English Translation, dated May 15, 2020, 9 pages.

(Continued)

*Primary Examiner* — Ida M Soward
(74) *Attorney, Agent, or Firm* — Quarles & Brady LLP

(57) ABSTRACT

Provided are a display panel and a display device. The display panel includes a transparent display region and a non-transparent display region. The display panel includes at least a first cathode and a second cathode; the first cathode is in the transparent display region; the second cathode is in the non-transparent display region; a first work function of the first cathode is greater than a second work function of the second cathode; and the first work function of the first cathode and the second working function of the second cathode are respectively in a range from 3.8 eV to 4.1 eV.

20 Claims, 8 Drawing Sheets

(51) Int. Cl.
  *H10K 59/12* (2023.01)
  *H10K 59/35* (2023.01)
  *H10K 59/60* (2023.01)
  *H10K 59/65* (2023.01)
  *H10K 50/828* (2023.01)
  *H10K 50/818* (2023.01)
  *H10K 102/00* (2023.01)
  *H10K 59/122* (2023.01)

(52) U.S. Cl.
  CPC ............ *H10K 59/60* (2023.02); *H10K 59/65* (2023.02); *G09G 2300/0408* (2013.01); *H10K 59/12* (2023.02); *H10K 59/122* (2023.02); *H10K 2102/351* (2023.02)

(58) Field of Classification Search
  CPC .... H10K 59/121; H10K 59/122; H10K 59/12; H10K 2102/3031; H10K 2102/3026; H10K 2102/351; G09G 2300/0408
  See application file for complete search history.

(56) References Cited

U.S. PATENT DOCUMENTS

| | | | | |
|---|---|---|---|---|
| 2007/0015429 | A1* | 1/2007 | Maeda | H10K 50/852 313/506 |
| 2014/0009720 | A1 | 1/2014 | Huang | |
| 2016/0299381 | A1* | 10/2016 | Lu | G02F 1/133553 |
| 2016/0343787 | A1 | 11/2016 | Wu | |
| 2017/0047544 | A1* | 2/2017 | Kang | H10K 71/00 |
| 2017/0090087 | A1 | 3/2017 | Goto et al. | |
| 2017/0110532 | A1* | 4/2017 | Kim | H10K 59/124 |
| 2017/0162111 | A1* | 6/2017 | Kang | H10K 50/844 |
| 2018/0011373 | A1 | 1/2018 | Zhou et al. | |
| 2018/0130421 | A1* | 5/2018 | Zhou | G09G 3/3266 |
| 2018/0166018 | A1* | 6/2018 | Yang | G09G 3/3266 |
| 2018/0261661 | A1* | 9/2018 | Jin | G02F 1/133602 |
| 2020/0052045 | A1* | 2/2020 | Kuo | G09G 3/20 |
| 2020/0052048 | A1* | 2/2020 | Kuo | G06F 1/1605 |
| 2020/0066809 | A1 | 2/2020 | Liu | |
| 2020/0089350 | A1* | 3/2020 | Han | G06F 3/0446 |
| 2020/0089355 | A1* | 3/2020 | Moon | G06F 3/0412 |
| 2020/0117034 | A1 | 4/2020 | Yin et al. | |
| 2020/0211480 | A1 | 7/2020 | Xiang et al. | |

FOREIGN PATENT DOCUMENTS

| | | | | |
|---|---|---|---|---|
| CN | 105633297 | A | | 1/2016 |
| CN | 104536179 | A | | 5/2017 |
| CN | 106654040 | A | | 5/2017 |
| CN | 107610635 | A | * 1/2018 | ............... G09G 3/36 |
| CN | 107622752 | A | | 1/2018 |
| CN | 108122956 | A | * 6/2018 | ........... H01L 27/124 |
| CN | 108389879 | A | * 8/2018 | ............... G09F 9/33 |
| CN | 108933159 | A | * 12/2018 | ........... G09G 3/3233 |
| CN | 109001934 | A | * 12/2018 | ......... G02F 1/13318 |
| CN | 107610636 | A | | 2/2021 |

OTHER PUBLICATIONS

International Search Report and Written Opinion (International Application No. PCT/CN2019/107918) with English Translation, dated Jan. 6, 2020, 9 pages.

* cited by examiner

DISPLAY PANEL AND DISPLAY DEVICE INCLUDING CATHODE SET

CROSS-REFERENCE TO RELATED APPLICATIONS

This application is a continuation application of International Application PCT/CN2019/107918, filed on Sep. 25, 2019, and entitled "DISPLAY PANEL AND DISPLAY DEVICE", which claims priority to Chinese Patent Application No. 201910252019.8, filed on Mar. 29, 2019, entitled "DISPLAY DEVICE AND DISPLAY PANEL THEREOF", the disclosures of both applications are hereby incorporated by reference in their entirety.

TECHNICAL FIELD

The present disclosure relates to the field of display technologies.

BACKGROUND

With the rapid development of display devices, the requirements of users for the screen-to-body ratio become higher and higher. Since components such as a camera, a sensor, and a handset usually need to be installed on the upper portion of the screen of a mobile terminal, a design of special-shaped screen (notch screen) is employed in related technologies. A partial region of the upper portion of the screen is usually cut off to install the above-mentioned components, thus affecting the unity of the screen, so that the full-screen display attracts more and more attention from the industry.

SUMMARY

An objective of the present disclosure is to provide a display panel for a full-screen display and a display device thereof.

In order to achieve the objective, a first aspect of the present disclosure is to provide a display panel including a transparent display region and a non-transparent display region. The display panel includes at least a first cathode and a second cathode. The first cathode is in the transparent display region, and the second cathode is in the non-transparent display region. A first work function of the first cathode is greater than a second work function of the second cathode. The first work function of the first cathode and the second working function of the second cathode are respectively in a range from 3.8 eV to 4.1 eV.

A second aspect of the present disclosure is to provide a display device, including a device body having a device region and the above-mentioned display panel. The display panel covering the device body. The device region is disposed under the transparent display region, and a photosensitive device emitting or receiving light through the transparent display region is disposed in the device region.

1) According to the embodiments of the present disclosure, the first work function of the first cathode corresponding to the transparent display region and the second work function of the second cathode corresponding to the non-transparent display region are so configured that the first work function of the first cathode is greater than the second work function of the second cathode, and that the first work function of the first cathode and the second work function of the second cathode are respectively in a range from 3.8 eV to 4.1 eV. The first work function of the first cathode is greater than the second work function of the second cathode, so that the transparent display region and the non-transparent display region meet the requirements for respective light-emitting efficiencies thereof. The ranges of the work functions of the first cathode and the second cathode are respectively from 3.8 eV to 4.1 eV, so that the light transmittances of the first cathode and the second cathode also meet the requirements for the respective regions thereof. The light-emitting efficiency, combining with the light transmittance, meets the requirements for the brightness consistency of the transparent display area and the non-transparent display area during displaying.

2) Alternatively, the first cathode and the second cathode contain the magnesium and the silver. The higher the volume percentage of the magnesium, the easier the electron injection is, the higher the light-emitting efficiency is, but the poorer the light transmittance is.

Alternatively, the first volume percentage of the magnesium in the first cathode ranges from 10% to 20%; and/or the second volume percentage of the magnesium in the second cathode ranges from 8% to 20%. The studies have shown that the volume percentages of the magnesium in the above ranges not only meet the requirements for the light-emitting efficiencies, but also meet the requirements for the light transmittances. In an embodiment, the second volume percentage of the magnesium in the second cathode is 10%, which can better match the display effect of the first cathode in the above-mentioned range.

3) In an alternative solution, the first thickness of the first cathode is less than the second thickness of the second cathode. The greater the first thicknesses of the first cathode and the second cathode are, the poorer the light transmittances are, but the smaller the resistances are, and the more electrons can be injected. In the ranges of the first volume percentages of the magnesium in the first cathode and the second cathode in the alternative solutions described in 2), the consistency of the brightness of the transparent display region and the brightness of the non-transparent display region during displaying can be further achieved by adjusting the thicknesses.

4) Alternatively, the first cathode includes the aluminum and the silver, and the second cathode includes the magnesium and the silver. The higher the volume percentage of the magnesium and the volume percentage of the aluminum, the easier the electron injection is, and the higher the light-emitting efficiency is, but the poorer the light transmittance is.

Alternatively, the third volume percentage of the aluminum in the first cathode ranges from 2% to 12%. Alternatively, the third volume percentage of the aluminum in the first cathode ranges from 2% to 6%; and/or the second volume percentage of the magnesium in the second cathode ranges from 8% to 20%. Alternatively, the second volume percentage of the magnesium in the second cathode is 10%. The studies have shown that the volume percentages of the aluminum and the volume percentages of the magnesium in the above ranges not only meet the requirements for the light-emitting efficiencies, but also meet the requirements for the light transmittances.

5) Alternatively, the first thickness of the first cathode is less than the second thickness of the second cathode. The greater the first thicknesses of the first cathode and the second cathode, the poorer the light transmittances are, but the smaller the resistances are, and the more electrons can be injected. In the ranges of the first volume percentage of the aluminum in the first cathode and the ranges of the second volume percentage of the magnesium in the second cathode in the alternative solutions described in 4), the consistency of the brightness of the transparent display region and the brightness of the non-transparent display region during displaying can be further achieved by adjusting the thicknesses.

6) Alternatively, the display panel includes the transparent display region, the non-transparent display region, and the transition region disposed between the transparent display region and the non-transparent display region. The third cathode is in the transition region. The material and the third thickness of the third cathode are identical to the material and the second thickness of the second cathode respectively. The pixel density of the transparent display region can be less than the pixel density of the non-transparent display region. A pixel density of the transition region can range between the pixel density of the transparent display region and the pixel density of the non-transparent display region. In other words, the transition region is also a kind of non-transparent display region, but by controlling the pixel densities, sudden changes in resolution can be prevented, thereby improving the display effect.

DETAILED DESCRIPTION OF THE EMBODIMENTS

Figure 1:
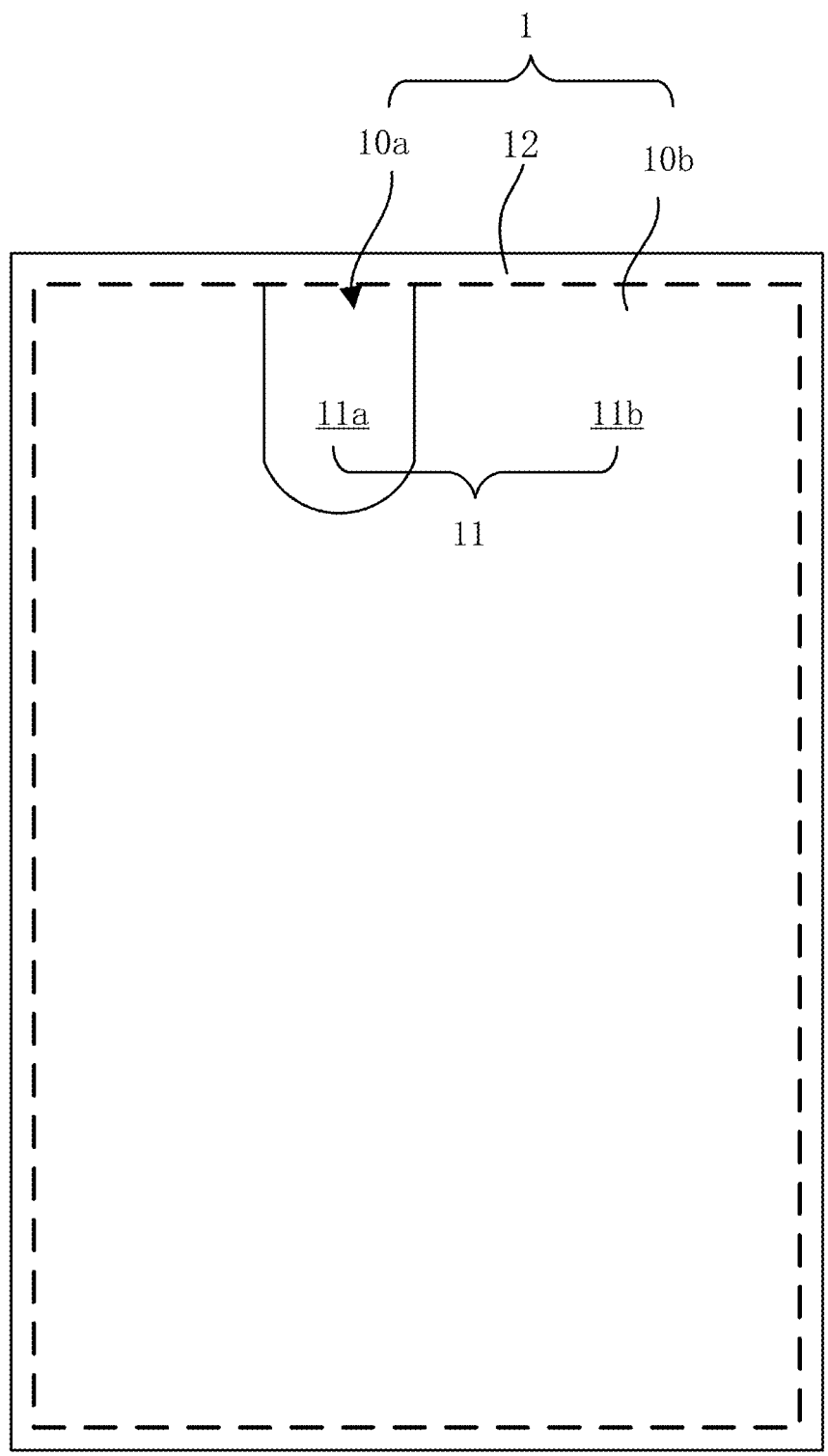
FIG. 1 is a top view illustrating a display panel according to a first embodiment of the present disclosure.

An organic light-emitting diode (OLED) device substantially includes an anode, an organic light-emitting layer, and a cathode, which are stacked. In order to improve the efficiency of electron injection, the cathode of the OLED should be made of metal material with a work function as low as possible, since the electron injection is more difficult than the hole injection. The magnitude of the work function of the metal heavily affects the light-emitting efficiency and the service life of OLED devices. The lower the work function of the metal, the easier the electron injection is, and the higher the light-emitting efficiency is. Moreover, the lower the work function, the lower the potential barrier of the organic/metal interface is, the less the joule heat is generated during operation, and the more greatly the service life of the device is improved.

However, a single-layered metal cathode, such as Mg, Ca, or the like, which has a low work function, is easy to be oxidized in the air, thus causing the device to be unstable, and shortening the service life. Therefore, an alloy of a metal with a low work function and a corrosion-resistant metal is generally selected to serve as a cathode to avoid this problem. When a single-metal cathode thin film is evaporated, a lot of defects will be formed, thus resulting in poorer oxidation resistance. However, when an alloy cathode is evaporated, a small amount of metals with relatively active chemical properties will preferentially diffuse into the defects, thereby making the entire cathode layer stable.

Therefore, developing a cathode structure having outstanding performance is one of the critical technologies promoting the technology development of the OLED industry.

In order to facilitate the understanding of the present disclosure, the exemplary embodiments of the present disclosure will be described in detail with reference to the relevant drawings. The present disclosure can be implemented in various forms, but is not limited to the embodiments described herein. In contrast, the objective of providing these embodiments is to make the disclosed description of the present disclosure to be understood more thoroughly.

Each range in the present disclosure includes end numerical values of both ends. The display panel of the present disclosure has a display surface (or referred to as a light-emitting surface). Different display regions of the display panel are different regions formed by dividing the display surface. In the direction perpendicular to the display surface and in the different display regions, the display panel can include a plurality of elements, such as the cathode, the OLED light-emitting material layer, and the anode. When the material composition of the various cathodes is described in the present disclosure, each cathode is not limited to be formed by the mentioned material only, but can also contain other materials. However, the contents of other materials are relatively small, for example, the other materials exist in the form of impurities, and the other materials do not affect the performance of each cathode, nor prevent the cathode from meeting requirements.

Referring to FIG. 1, a display panel 1 includes at least a transparent display region 10$a$ and a non-transparent display region 10$b$. A cathode set 11 includes at least a first cathode 11$a$ and a second cathode 11$b$. The first cathode 11$a$ is in the transparent display region 10$a$, and the second cathode 11$b$ is in the non-transparent display region 10$b$. A first work function of the first cathode 11$a$ is greater than a second work function of the second cathode 11$b$. The first work function of the first cathode 11$a$ and the second work function of the second cathode 11$b$ are respectively in a range from 3.8 eV to 4.1 eV.

The first work function of the first cathode 11$a$ is greater than the second work function of the second cathode 11$b$, so that the transparent display region 10$a$ and the non-transparent display region 10$b$ meet the requirements for respective light-emitting efficiencies thereof. The first work function of the first cathode 11$a$ and the second work function of the second cathode 11$b$ are respectively in the range from 3.8 eV to 4.1 eV, so that the light transmittances of the first cathode 11$a$ and the second cathode 11$b$ also meet the requirements for respective regions thereof. The light-emitting efficiency, combining with the light transmittance, makes the transparent display area 10$a$ and the non-transparent display area 10$b$ meet the requirements of the brightness consistency during displaying.

In an alternative embodiment, the first cathode 11$a$ and the second cathode 11$b$ can include magnesium and silver. The higher the volume percentage of magnesium, the easier the electron injection is, and the higher the light-emitting efficiency is, but the poorer the light transmittance is.

Alternatively, the first volume percentage of magnesium in the first cathode 11$a$ has a range from 10% to 20%; and/or the second volume percentage of magnesium in the second cathode 11$b$ has a range from 8% to 20%. The studies have shown that the volume percentages of the magnesium in the above ranges can not only meet the requirements for the light-emitting efficiencies, but also meet the requirements for the light transmittances. Alternatively, the second volume percentage of the magnesium in the second cathode 11$b$ is 10%.

In this alternative embodiment, the volume percentage of the magnesium of 10% to 20% refers to the first volume percentage of the magnesium in the first cathode 11$a$ containing only magnesium and silver. In other words, the fourth volume percentage of silver in the first cathode 11$a$ is from 80% to 90%. In other alternative solutions, in addition to the magnesium and the silver, the first cathode 11$a$ of a preferred solution can further include other elements, and only the volume percentage of the magnesium is limited. The range of the second volume percentage of the magnesium in the second cathode 11$b$ is from 8% to 20%. Similarly, in this alternative embodiment, the second cathode 11$b$ contains only the magnesium and the silver, and the fifth volume percentage of silver is in a range from 80% and 92%. In other alternative solutions, in addition to the magnesium and the silver, the second cathode 11$b$ of the above-mentioned preferred solution can further include other elements, and only the second volume percentage of the magnesium is limited.

The greater the thicknesses of the first cathode and the second cathode, the poorer the light transmittances are, but the smaller the resistances are, and the more electrons can be injected. In the ranges of the volume percentages of the magnesium in the first cathode 11$a$ and in the second cathode 11$b$, the consistency of the brightness of the transparent display region 10$a$ and the brightness of the non-transparent display region 10$b$ during displaying can be achieved by further adjusting the thicknesses of the first cathode 11$a$ and the second cathode 11$b$.

Specifically, the first thickness of the first cathode 11$a$ can be less than the second thickness of the second cathode 11$b$.

Alternatively, the first thickness of the first cathode 11$a$ is in a range from 50 Å to 100 Å. Alternatively, the first thickness of the first cathode 11$a$ is in a range from 60 Å to 90 Å; and/or the second thickness of the second cathode 11$b$ is in a range from 100 Å to 145 Å. Alternatively, the second thickness of the second cathode 11$b$ is in a range from 110 Å to 130 Å.

The transparent display region 10$a$ and the non-transparent display region 10$b$ can include light-emitting units arranged in an array. Each light-emitting unit disposed in the transparent display region 10$a$ includes one or more first OLED sub-pixels, and each light-emitting unit disposed in the non-transparent display region 10$b$ includes one or more second OLED sub-pixels. Each of the first OLED sub-pixels and each of the second OLED sub-pixels are configured to emit light of a primary color, for example, red, green, and blue, or red, green, blue, and yellow, which are not limited in the present disclosure. In an embodiment of the present disclosure, the display panel 1 further includes a frame region 12, and the frame region 12 is the frame region in the related art.

Figure 2:
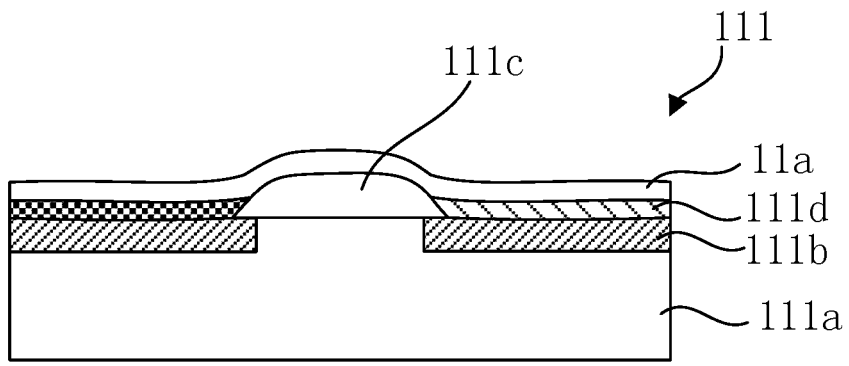
FIG. 2 is a schematic section view illustrating a first OLED sub-pixel according to an embodiment of the present disclosure.

FIG. 2 is a schematic section view illustrating the first OLED sub-pixel according to an embodiment of the present disclosure. Referring to FIG. 2, each of the first OLED sub-pixels 111, from bottom to top, sequentially includes: a light-transmitting anode 111$b$ formed on a light-transmitting substrate 111$a$, a pixel defining layer 111$c$ having an opening, an OLED light-emitting material layer 111$d$ disposed in the opening, and a first cathode 11$a$ disposed on the OLED light-emitting material layer 111$d$. When a driving voltage is applied between the light-transmitting anode 111$b$ and the first cathode 11$a$ of each of the first OLED sub-pixels 111, the transparent display region 10$a$ performs the display function. When no driving voltage is applied between the light-transmitting anode 111$b$ and the first cathode 11$a$ of each of the first OLED sub-pixels 111, the transparent display region 10$a$ performs the function of transmitting light.

Figure 3:
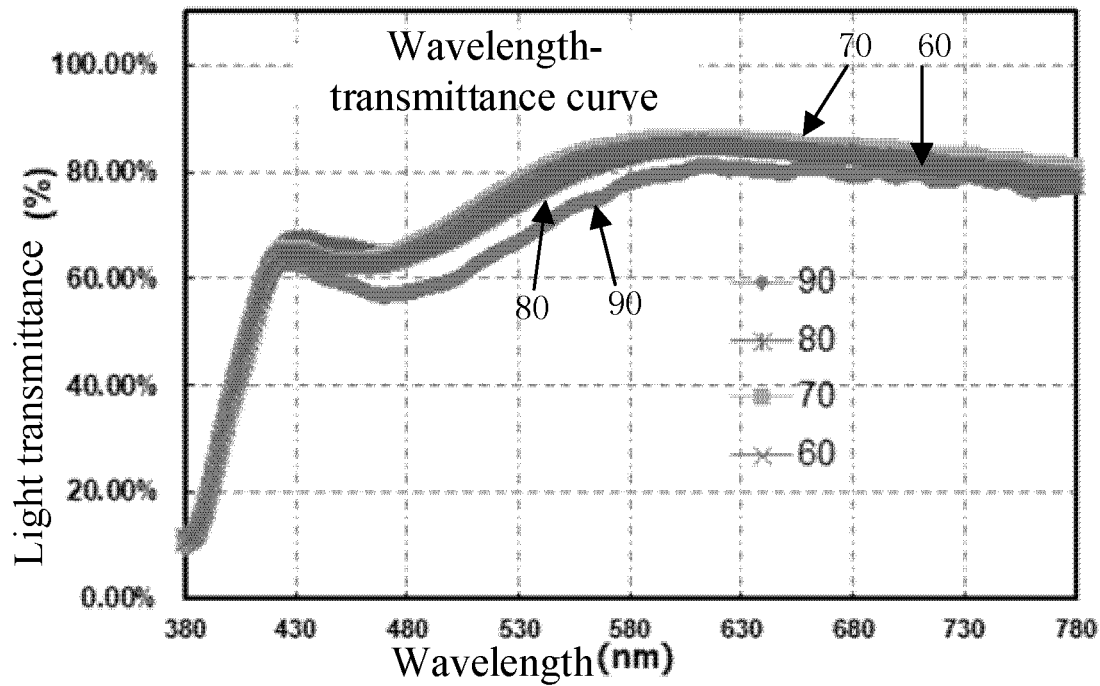
FIG. 3 and FIG. 4 illustrate wavelength-transmittance curves of light and luminance-voltage curves of light respectively according to first blue OLED sub-pixels of four embodiments, and in the blue first OLED sub-pixels of the four embodiments, first volume percentages of magnesium in first cathodes each are 10%, and first thicknesses of the first cathodes are respectively 60 Å, 70Å, 80 Å, and 90 Å.
Figure 4:
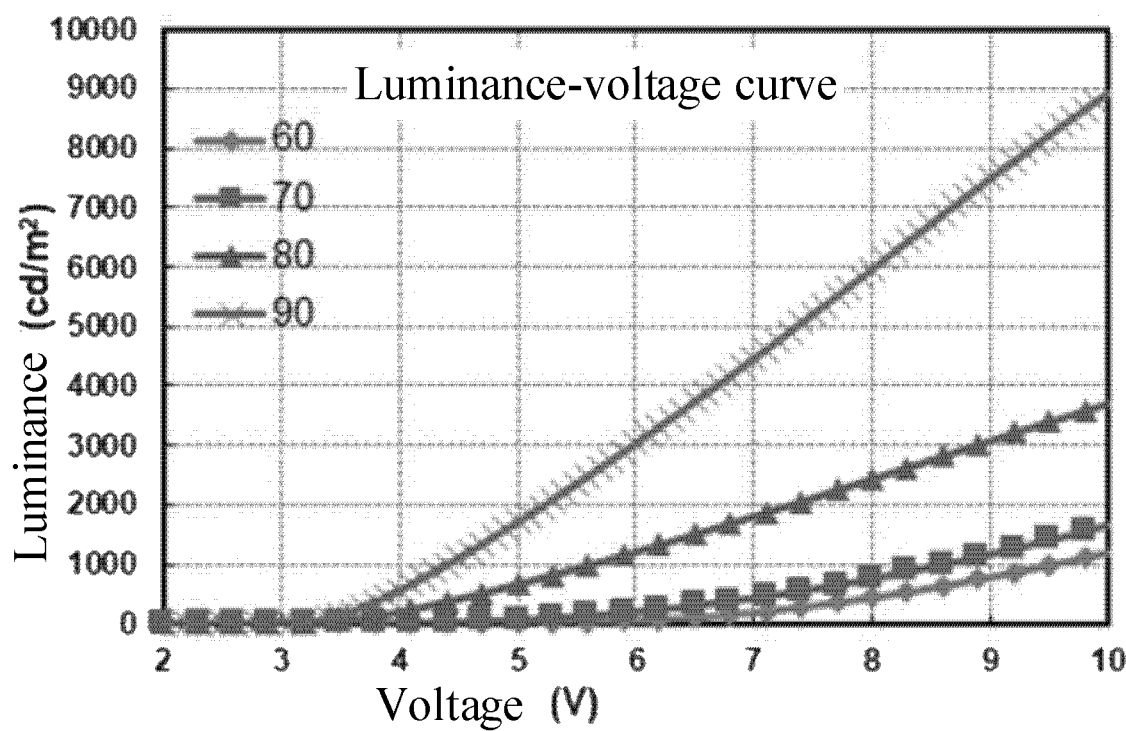

In order to verify the beneficial effects of the above-mentioned alternative solutions, the inventors have done many experiments. FIG. 3 and FIG. 4 illustrate the wavelength-transmittance curves of light and the luminance-voltage curves of light respectively according to the first blue OLED sub-pixels of four embodiments, and in the blue first OLED sub-pixels of the four embodiments, the first volume percentages of the magnesium in the first cathodes each are 10%, and the first thicknesses of the first cathodes are respectively 60 Å, 70Å, 80 Å, and 90 Å.

Referring to FIG. 3, it can be seen that in the wave band from 430 nm to 780 nm, when the first thickness of the first cathode 11a is 60Å, 70 Å, or 80 Å, the light transmittance of the transparent display region 10a is greater than 60%; and when the first thickness of the first cathode 11a is 90Å, the light transmittance of the transparent display region 10a is substantially greater than 60%.

Referring to FIG. 4, when the driving voltage applied between the light-transmitting anode 111b and the first cathode 11a is 7V, the light-emitting luminance of the transparent display region 11a substantially satisfies the requirements. Especially, when the first thickness is 80 Å or 90 Å, the light-emitting luminance is greater than 1000 cd/m$^2$.

Figure 5:
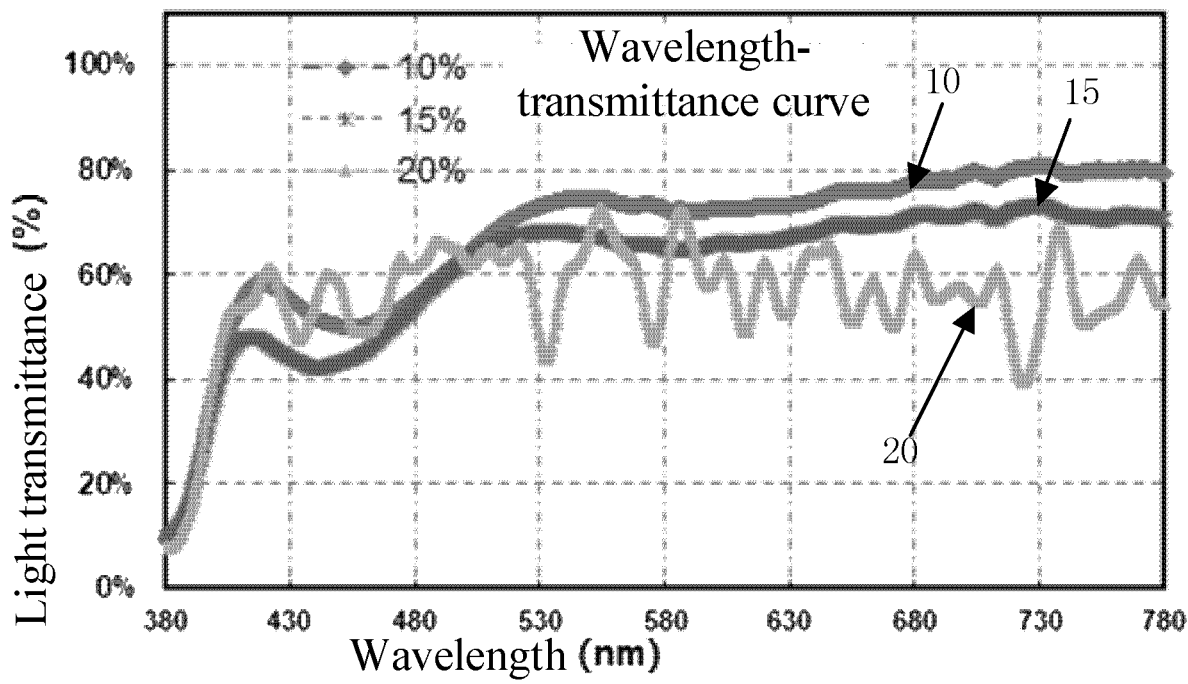
FIG. 5 and FIG. 6 illustrate wavelength-transmittance curves of light and luminance-voltage curves of light respectively according to first red OLED sub-pixels of three embodiments, and in the red first OLED sub-pixels of the three embodiments, the first volume percentages of magnesium in the first cathodes are respectively 10%, 15%, and 20%, and the first thicknesses of the first cathodes each are 80 Å.
Figure 6:
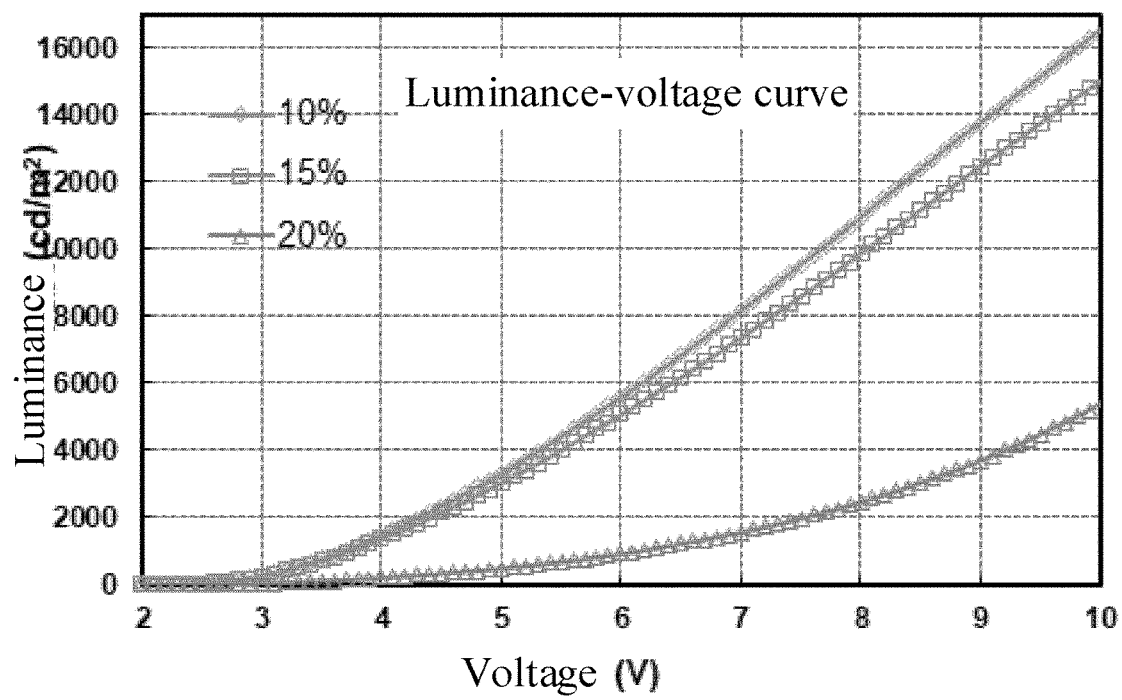

FIG. 5 and FIG. 6 illustrate the wavelength-transmittance curves of light and the luminance-voltage curves of light respectively according to the first red OLED sub-pixels of three embodiments, and in the red first OLED sub-pixels of the three embodiments, the first volume percentages of the magnesium in the first cathodes are respectively 10%, 15%, and 20%, and the first thicknesses of the first cathodes each are 80 Å.

Referring to FIG. 5, it can be seen that in the wave band from 430 nm to 780 nm, the light transmittance of the transparent display region 10a is substantially 60%. Especially, in the wave band from 530 nm to 780 nm, when the first volume percentages of magnesium are respectively 10% and 15%, the light transmittances are greater than 60%.

Referring to FIG. 6, when the driving voltage applied between the light-transmitting anode 111b and the first cathode 11a is 7V, the light-emitting luminance of the transparent display region 11a substantially satisfies the requirements. Especially, when the first volume percentages of the magnesium are respectively 10% and 15%, the light-emitting luminance is greater than 6000 cd/m$^2$.

In order to verify the beneficial effects of the above-mentioned alternative solutions, the inventors have done several comparison experiments. Table 1 is a table of experimental results of the examples and comparative examples. As shown in Table 1:

TABLE 1

Experimental Results of Examples and Comparative Examples

| Item | First Volume percentage (%) of magnesium in magnesium and silver | First Thickness (Å) | Average light transmittance (%) in wave band from 380 nm to 780 nm | Luminance (cd/m$^2$) when only blue OLED sub-pixel emits light under driving voltage of 7 V |
|---|---|---|---|---|
| Example 1 | 12 | 65 | 88 | 2000 |
| Example 2 | 14 | 75 | 83 | 4000 |
| Example 3 | 16 | 70 | 78 | 3000 |
| Example 4 | 18 | 80 | 75 | 5000 |
| Comparative example 1 | 5 | 60 | 90 | 850 |
| Comparative example 2 | 8 | 90 | 88 | 700 |
| Comparative example 3 | 30 | 100 | 40 | 500 |

It should be noted that, in the OLED sub-pixels of the three primary colors of red, green, and blue, the light-emitting luminance of the blue OLED sub-pixel is the lowest. When the light-emitting luminance of the blue OLED sub-pixel meets the requirements, the light-emitting luminance of the red and green OLED sub-pixels also meets the requirements.

In another alternative solution, the first cathode 11a contains aluminum and silver, and the second cathode 11b contains magnesium and silver. The higher the volume percentage of the magnesium and the volume percentage of the aluminum, the easier the electron injection is, the higher the light-emitting efficiency is, but the poorer the light transmittance is.

Alternatively, the third volume percentage of the aluminum in the first cathode 11a is in a range from 2% to 12%. Alternatively, the third volume percentage of the aluminum in the first cathode 11a is in a range from 2% to 6%, and/or the second volume percentage of the magnesium in the second cathode 11b is in a range from 8% to 20%. Alternatively, the second volume percentage of the magnesium in the second cathode 11b is 10%. The studies have shown that the third volume percentage of the aluminum and the second volume percentage of the magnesium in the above ranges not only meet the requirements for the light-emitting efficiencies, but also meet the requirements for the light transmittances.

In an alternative solution, the third volume percentage of the aluminum ranging from 2% to 12% is the third volume percentage of the aluminum in the first cathode 11a containing only the aluminum and the silver. In other words, the fourth volume percentage of the silver in the first cathode 11a ranges between 82% and 92%. In other alternative solutions, in addition to the magnesium and the silver, the first cathode 11a of the above-mentioned preferred solution can further contain other elements, and only the first volume percentage of the magnesium is limited. The range of the second volume percentage of the magnesium in the second cathode 11b is from 8% to 20%. Similarly, in this alternative embodiment, the second cathode 11b contains only the magnesium and the silver, and a fifth volume percentage of the silver ranges between 80% and 92%. In other alternative solutions, in addition to the aluminum and the silver, the second cathode 11b of the above-mentioned preferred solution can further contain other elements, and only the second volume percentage of the magnesium is limited.

The greater the first thicknesses of the first cathode and the second cathode, the poorer the light transmittances are, but the smaller the resistances are, and the more electrons can be injected. In the range of the third volume percentage of the aluminum in the first cathode 11a and in the range of the second volume percentage of the magnesium in the second cathode 11b, the consistency of the brightness of the transparent display region 10a and the brightness of the non-transparent display region 10b during displaying can be achieved by further adjusting the first thicknesses of the first cathode 11a and the second cathode 11b.

Specifically, the first thickness of the first cathode 11a can be less than the second thickness of the second cathode 11b.

Alternatively, the first thickness of the first cathode 11a ranges from 40 Å to 100 Å. Alternatively, the first thickness of the first cathode 11a ranges from 70 Å to 90 Å, and/or the second thickness of the second cathode 11b ranges from 100 Å to 145 Å. Alternatively, the second thickness of the second cathode 11b ranges from 110 Å to 130 Å.

Figure 7:
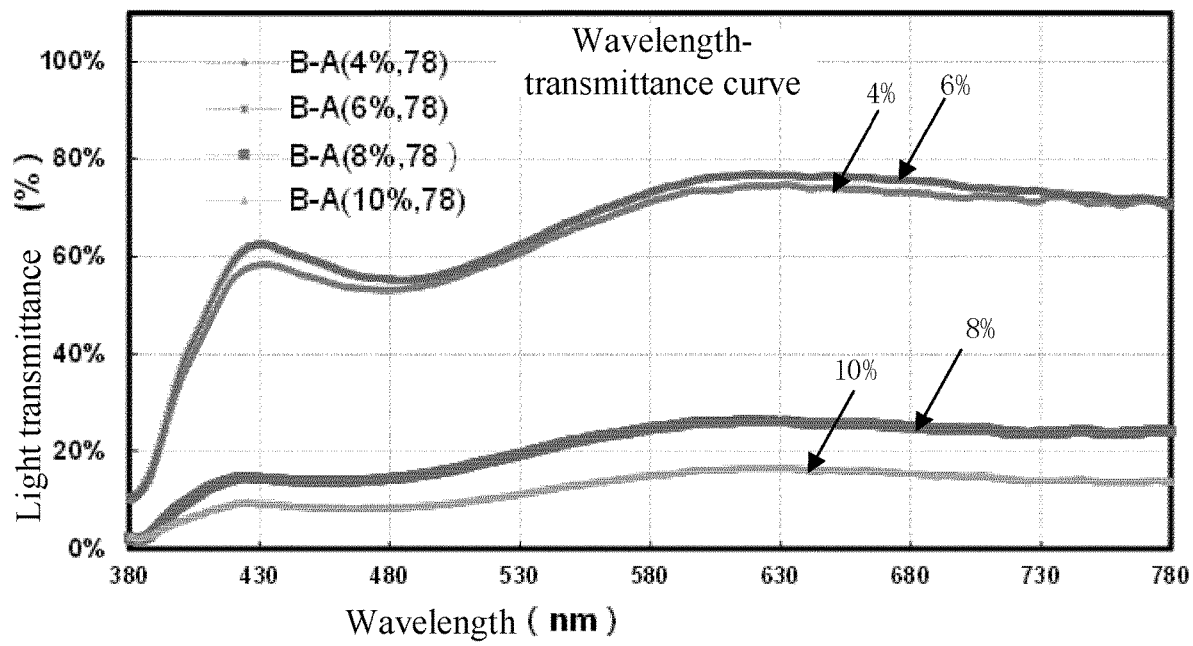
FIG. 7 illustrates wavelength-transmittance curves of light of first red OLED sub-pixels of four embodiments, and in the first red OLED sub-pixels of the four embodiments, the third volume percentages of aluminum in the first cathodes are respectively 4%, 6%, 8%, and 10%, and the first thicknesses of the first cathodes each are 78 Å.
Figure 8:
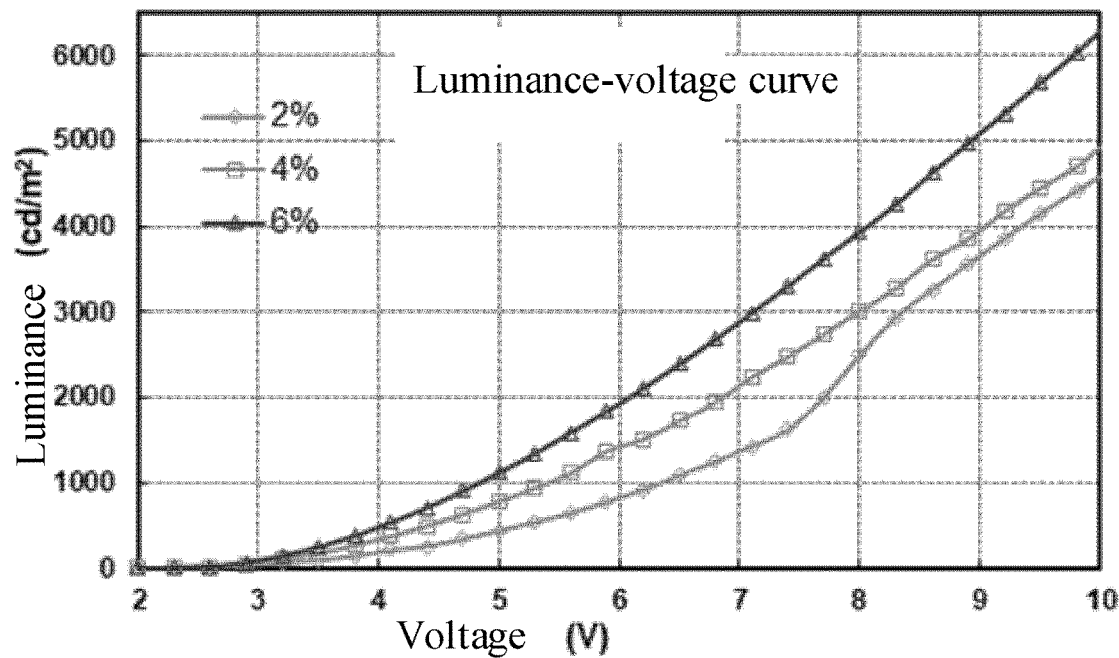
FIG. 8 illustrates luminance-voltage curves of light of the first red OLED sub-pixels of three embodiments, and in the first red OLED sub-pixels of the three embodiments, the third volume percentages of aluminum in the first cathodes are respectively 2%, 4%, and 6%, and the first thicknesses of the first cathodes each are 78 Å.

In order to verify the beneficial effects of the above-mentioned alternative solutions, the inventors have done several experiments. FIG. 7 illustrates the wavelength-transmittance curves of light of the first red OLED sub-pixels of four embodiments, and in the first red OLED sub-pixels of the four embodiments, the third volume percentages of the aluminum in the first cathodes are respectively 4%, 6%, 8%, and 10%, and the first thicknesses of the first cathodes each are 78 Å. FIG. 8 illustrates the luminance-voltage curves of light of the first red OLED sub-pixels of three embodiments, and in the first red OLED sub-pixels of the three embodiments, the third volume percentages of the aluminum in the first cathodes are respectively 2%, 4%, and 6%, and the first thicknesses of the first cathodes each are 78 Å.

Referring to FIG. 7, it can be seen that in the wave band from 380 nm to 780 nm, the light transmittance of the transparent display region 10a substantially meets the requirements. Especially, in the wave band from 530 nm to 780 nm, when the third volume percentages of the aluminum are respectively 4% and 6%, the light transmittances are substantially greater than 60%.

Referring to FIG. 8, when the driving voltage applied between the light-transmitting anode 111b and the first cathode 11a is 7V, the light-emitting luminance of the transparent display region 10a is greater than 1000 cd/m².

Figure 9:
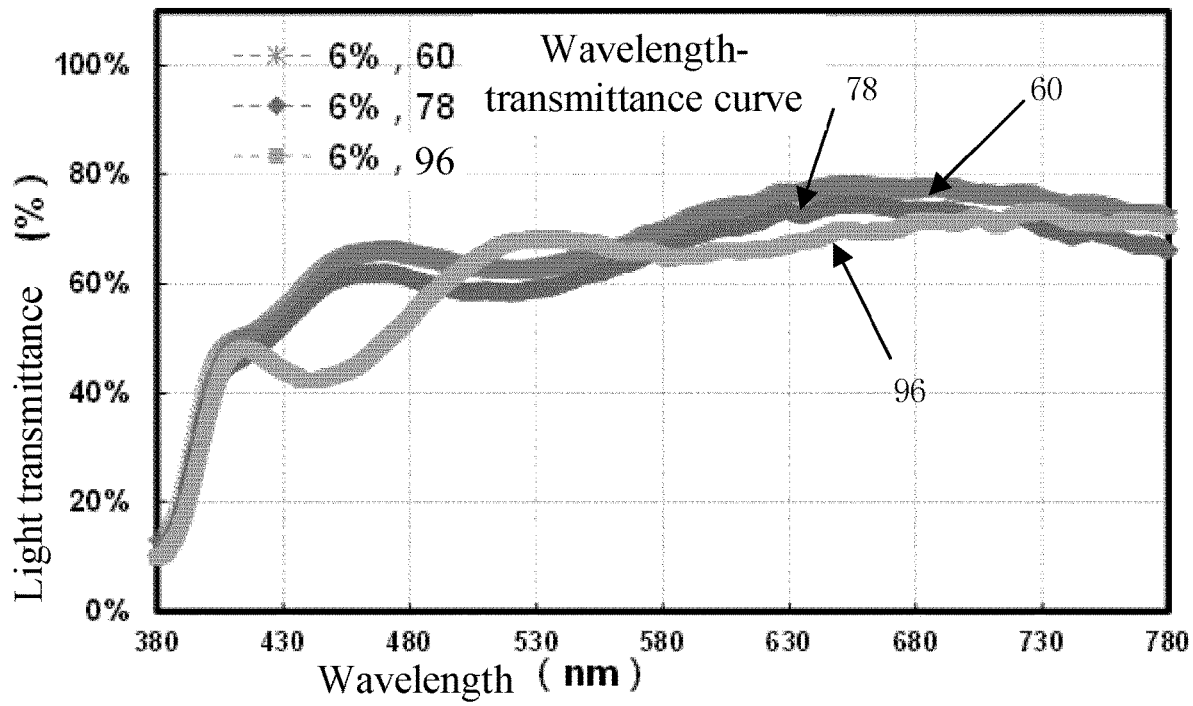
FIG. 9 and FIG. 10 illustrate wavelength-transmittance curves of light and luminance-voltage curves of light respectively according to the first blue OLED sub-pixels of three embodiments, and in the first blue OLED sub-pixels of the three embodiments, the third volume percentages of aluminum in the first cathodes each are 6%, and the first thicknesses of the first cathodes are 60 Å, 78 Å, and 96 Å respectively.
Figure 10:
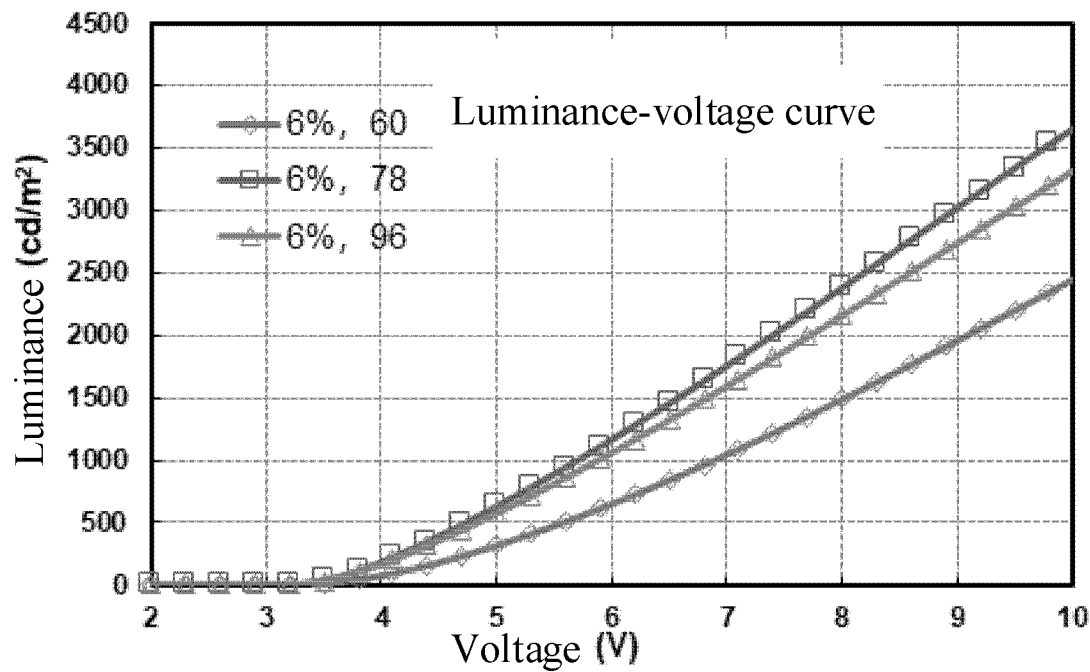

FIG. 9 and FIG. 10 illustrate the wavelength-transmittance curves of light and the luminance-voltage curves of light respectively according to the first blue OLED sub-pixels of three embodiments, and in the first blue OLED sub-pixels of the three embodiments, the third volume percentages of the aluminum in the first cathodes each are 6%, and the first thicknesses of the first cathodes are 60 Å, 78 Å, and 96 Å respectively.

Referring to FIG. 9, it can be seen that in the wave band from 430 nm to 780 nm, the light transmittance of the transparent display region 10a is substantially 60%.

Referring to FIG. 10, when the driving voltage applied between the light-transmitting anode 111b and the first cathode 11a is 7V, the light-emitting luminance of the transparent display region 10a is greater than 1000 cd/m².

Figure 11:
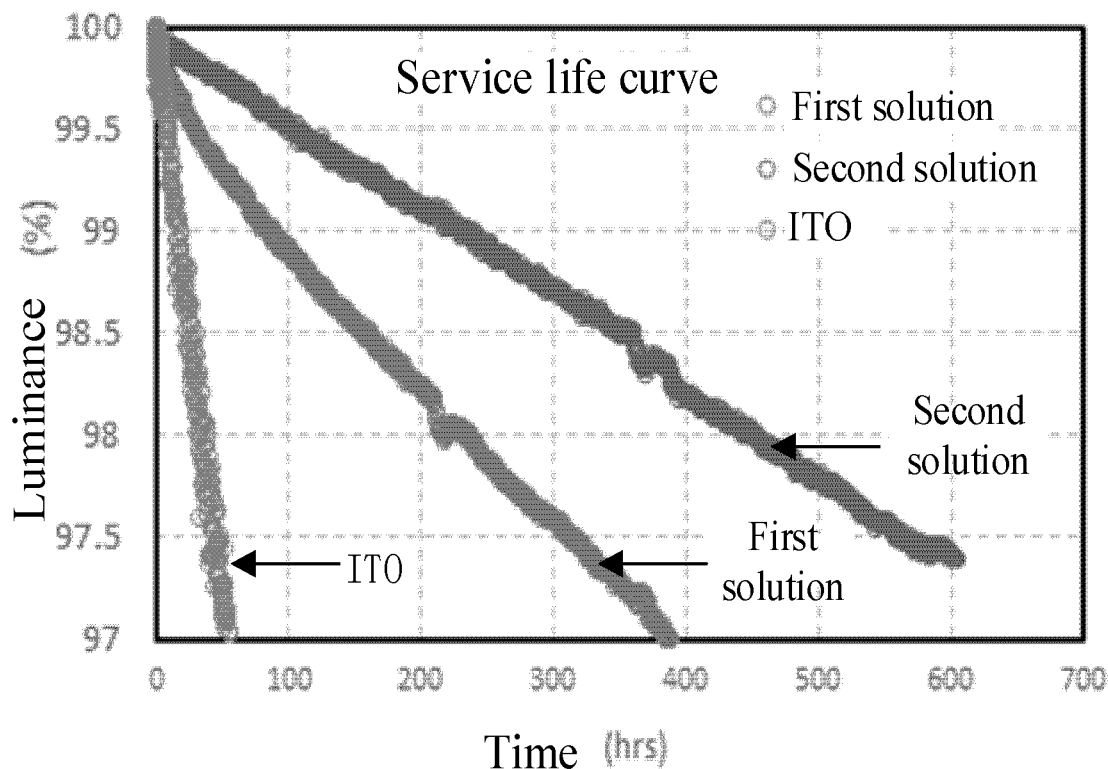
FIG. 11 illustrates service life curves of the first cathode containing ITO, the first cathode containing magnesium and silver, and the first cathode containing aluminum and silver respectively when only the first green OLED sub-pixel emits light.

FIG. 11 illustrates the service life curves of the first cathode 11a containing ITO, the first cathode 11a containing the magnesium and the silver (i.e. the first solution in FIG. 11), and the first cathode 11a containing the aluminum and the silver (i.e. the second solution in FIG. 11) respectively when only the first green OLED sub-pixel emits light.

Referring to FIG. 11, the service life of the first cathode 11a containing the magnesium and the silver (i.e. the first solution in FIG. 11) and the service life of the first cathode 11a containing the aluminum and the silver (i.e. the second solution in FIG. 11) are greater than the service life of the first cathode 11a containing ITO.

Figure 12:
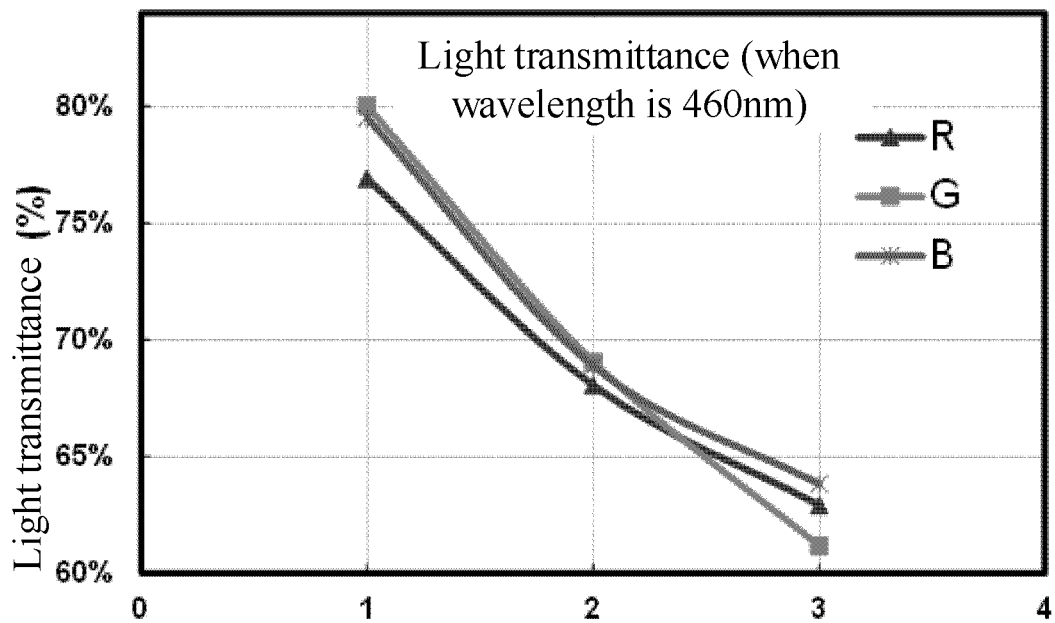
FIG. 12 illustrates transmittance-comparison curves of the first cathode containing ITO, the first cathode containing magnesium and silver, and the first cathode containing aluminum and silver respectively, when the wavelength is 460 nm, wherein an abscissa 1 corresponds to the first cathode containing ITO, an abscissa 2 corresponds to the first cathode containing magnesium and silver, and an abscissa 3 corresponds to the first cathode containing aluminum and silver.

FIG. 12 illustrates the transmittance-comparison curves of the first cathode 11a containing ITO, the first cathode 11a containing the magnesium and the silver (i.e. the first solution in FIG. 11), and the first cathode 11a containing the aluminum and the silver (i.e. the second solution in FIG. 11) respectively, when the wavelength is 460 nm, wherein the abscissa 1 corresponds to the first cathode 11a containing ITO, the abscissa 2 corresponds to the first cathode 11a containing the magnesium and the silver, and the abscissa 3 corresponds to the first cathode 11a containing the aluminum and the silver.

It can be seen that, when the wavelength is 460 nm, the light transmittance of the cathode 11a containing the magnesium and the silver and the light transmittance of the first cathode 11a containing the aluminum and the silver each are less than the light transmittance of the first cathode 11a containing ITO, but range between 60% and 70%, which substantially meet the requirements for the light transmittance of the transparent display region 10a.

It should be noted that in the wave band from 380 nm to 780 nm, the transmittances of light with other wavelengths greater than 460 nm are greater than the transmittance of the light with the wavelength of 460 nm.

Figure 13:
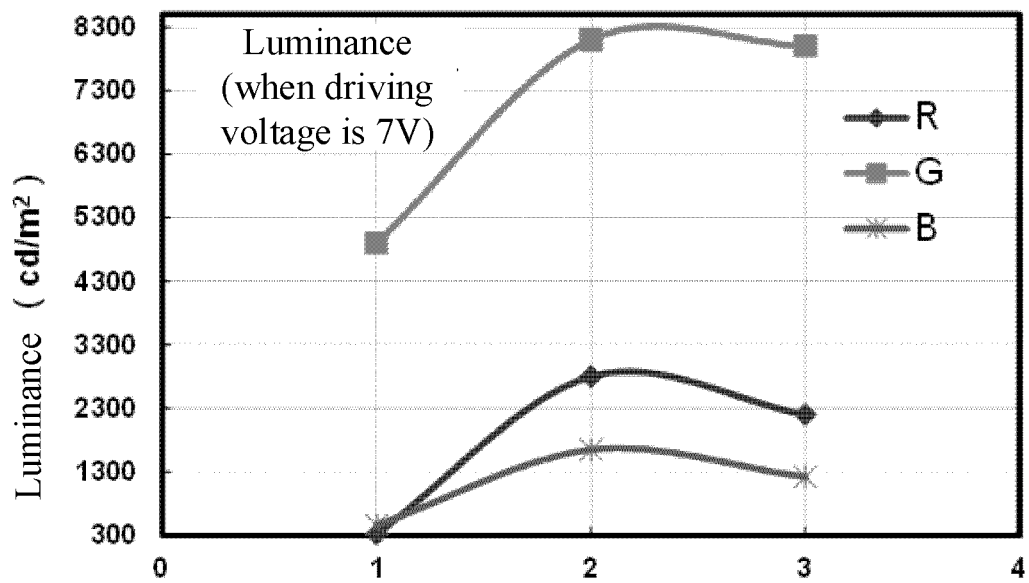
FIG. 13 illustrates brightness-comparison curves of the first cathode containing ITO, the first cathode containing magnesium and silver, and the first cathode containing aluminum and silver respectively, when the driving voltage between the light-transmitting anode and the first cathode is 7V, wherein the abscissa 1 corresponds to the first cathode containing ITO, the abscissa 2 corresponds to the first cathode containing magnesium and silver, and the abscissa 3 corresponds to the first cathode containing aluminum and silver.

FIG. 13 illustrates the brightness-comparison curves of the first cathode 11a containing ITO, the first cathode 11a containing the magnesium and the silver, and the first cathode 11a containing the aluminum and the silver respectively, when the driving voltage between the light-transmitting anode 111b and the first cathode 11a is 7V, wherein the abscissa 1 corresponds to the first cathode 11a containing ITO, the abscissa 2 corresponds to the first cathode 11a containing the magnesium and the silver, and the abscissa 3 corresponds to the first cathode 11a containing the aluminum and the silver.

It can be seen that the brightness of the first cathode 11a containing the magnesium and the silver and the brightness of the first cathodes 11a containing the aluminum and the silver are greater than the brightness of the first cathode 11a containing ITO.

In order to verify the beneficial effects of the above-mentioned alternative solutions, the inventors have done several comparison experiments. Table 2 is a table of experimental results of the alternative examples and comparative examples. As shown in Table 2:

TABLE 2

Experimental Results of Examples and Comparative Examples

| Item | Third Volume percentage (%) of aluminum in aluminum and silver | First Thickness (Å) | Average light transmittance (%) in wave band from 380 nm to 780 nm | Luminance (cd/m2) when only blue OLED sub-pixel emits light under driving voltage of 7 V |
|---|---|---|---|---|
| Example 1 | 2 | 65 | 80 | 2000 |
| Example 2 | 3 | 75 | 79 | 5000 |
| Example 3 | 4 | 70 | 78 | 4500 |
| Example 4 | 5 | 80 | 70 | 3000 |
| Comparative example 1 | 10 | 60 | 30 | 4500 |
| Comparative example 2 | 10 | 90 | 20 | 6000 |
| Comparative example 3 | 30 | 100 | 10 | 1000 |

It should be noted that, in the OLED sub-pixels of the three primary colors of red, green, and blue, the light-emitting luminance of the blue OLED sub-pixel is the lowest. If the light-emitting luminance of the blue OLED sub-pixel meets the requirements, then the light-emitting luminance of the red OLED sub-pixel and the light-emitting luminance of the green OLED sub-pixel meet the requirements.

In yet another alternative solution, the above-mentioned two alternative examples can also be combined, that is, the first cathode 11a contains the aluminum, the magnesium, and the silver, and the second cathode 11b contains the magnesium and the silver.

In this alternative solution, the first volume percentage of the magnesium and the third volume percentage of the aluminum in the first cathode 11a can be distributed in proportion in the above-mentioned alternative solutions, for example, half and half. The first volume percentage of the magnesium is in a range from 5% to 10%, and the third volume percentage of aluminum is in a range from 1% to 6%. Alternatively, the third volume percentage of the aluminum ranges from 1% to 3%. The first thickness of the first cathode 11a can range between 40 Å and 100 Å, or between 50 Å and 100 Å.

Figure 14:
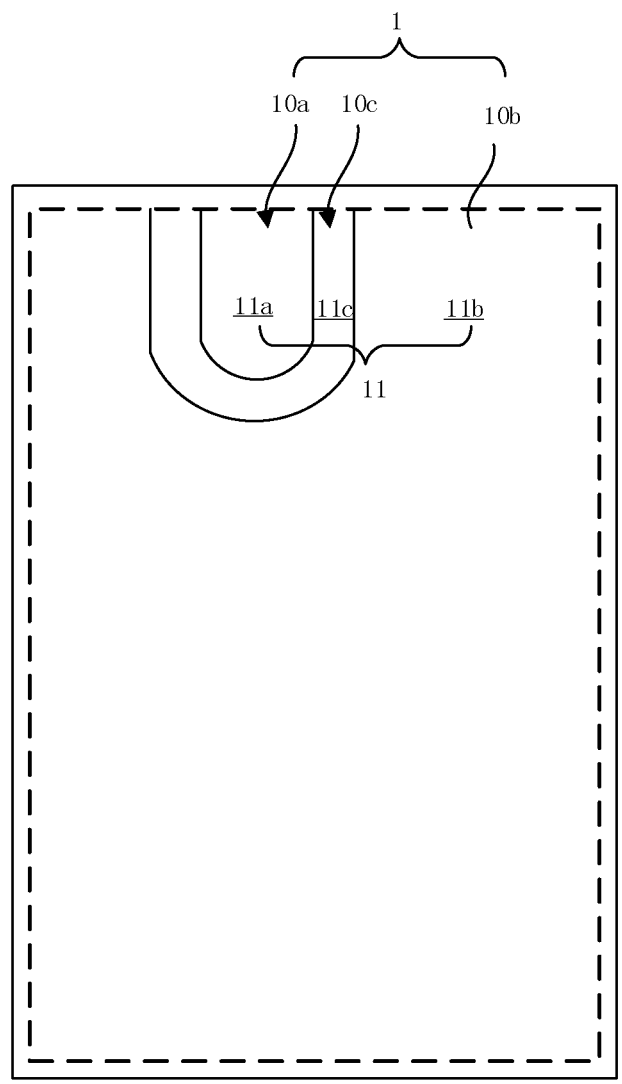
FIG. 14 is a top view illustrating the display panel including a transition region according to a second embodiment of the present disclosure.

FIG. 14 is a top view illustrating the display panel according to the second embodiment of the present disclosure.

Referring to FIG. 14, the display panel 1 includes a transparent display region 10a, a non-transparent display region 10b, and a transition region 10c disposed between the transparent display region 10a and the non-transparent display region 10b. The cathode set 11 further includes a third cathode 11c corresponding to the transition region 10c. A material and a third thickness of the third cathode 11c are identical to a material and a second thickness of the second cathode 11b respectively.

A pixel density of the transparent display region 10a can be less than a pixel density of the non-transparent display region 10b. A pixel density of the transition region 10c can range between a pixel density of the transparent display region 10a and a pixel density of the non-transparent display region 10b. The transition region 10c is also a kind of non-transparent display region. By controlling the pixel densities, sudden changes in resolution between the transparent display region 10a and the non-transparent display region 10b can be prevented, thereby improving the display effects.

In the display panel 1, a first anode is in the transparent display region 10a, and a second anode is in the non-transparent display region 10b. The first anode is a light-transmitting anode, and the work function of the light-transmitting anode ranges from 4.4 eV to 5 eV; the second anode is a reflective anode, and the reflective anode includes a light-transmitting layer and a reflective layer; the work function of the light-transmitting layer ranges from 4.4 eV to 5 eV; and/or the reflectivity of the reflective anode ranges from 90% to 100%.

By combining the first anode with the first cathode, and combining the second anode with the second cathode, in the wave band from 380 nm to 780 nm, it can be achieved that the average light transmittance of the transparent display region 10a is between 60% and 70%, and that the average light transmittance of the non-transparent display region 10b is between 40% and 45%, thereby achieving the consistency of the light-emitting luminance of the transparent display region 10a and the light-emitting luminance of the non-transparent display region 10b.

In an alternative solution, as for the display panel having the transition region 10c, the third anode is in the transition region 10c, and a material of the third anode is identical to a material of the second anode.

In an embodiment, the display panel further includes a first OLED light-emitting material layer and a second OLED light-emitting material layer. The first OLED light-emitting material layer is in the transparent display region, and the second OLED light-emitting material layer is in the non-transparent display region. The first OLED light-emitting material layer is disposed between the first cathode and the first anode. The second OLED light-emitting material layer is disposed between the second cathode and the second anode.

In an embodiment, the display panel further includes a third OLED light-emitting material layer, and the third OLED light-emitting material layer is in the transition region. The third OLED light-emitting material layer is disposed between the third cathode and the third anode.

Based on the above-mentioned display panel 1, the present disclosure further provides a display device.

The display device can be a mobile phone, a tablet, an on-board display, or the like.

The display device includes: a device body having a device region; and any one of the above-mentioned display panel covering the device body; the device region is disposed under the transparent display region 10a of the display panel, and a photosensitive device emitting or receiving light through the transparent display region 10a is disposed in the device region.

The photosensitive device can include a camera and/or a light sensor. The light sensor can include either an iris recognition sensor or a fingerprint recognition sensor, or a combination thereof.

All technical features in the embodiments can be executed in arbitrary combinations. For the purpose of simplifying the description, not all arbitrary combinations of the technical features in the embodiments above are described. However, as long as such combinations of the technical features are not contradictory, they should be considered as falling within the scope described in the specification.

The above embodiments merely illustrate several implementations of the disclosure. The description of the embodiments is relatively specific and detailed, but should not be understood to be limitations to the scope of the present disclosure. It should be noted that, for those skilled in the art, various deformations and improvements can be made without departing from the concept of the present disclosure. These deformations and improvements are all within the protection scope of the present disclosure. Therefore, the protection scope of the present disclosure is defined by the appended claims.

What is claimed is:

1. A display panel, comprising a transparent display region and a non-transparent display region, wherein
the display panel comprises at least a first cathode and a second cathode;
the first cathode is in the transparent display region;
the second cathode is in the non-transparent display region;
a first work function of the first cathode is greater than a second work function of the second cathode; and
the first work function of the first cathode and the second working function of the second cathode are respectively in a range from 3.8 eV to 4.1 eV.

2. The display panel of claim 1, wherein the first cathode and the second cathode contain magnesium and silver; and
a first volume percentage of the magnesium in the first cathode is in a range from 10% to 20%; and a second volume percentage of the magnesium in the second cathode is in a range from 8% to 20%.

3. The display panel of claim 2, wherein the second volume percentage of the magnesium in the second cathode is 10%.

4. The display panel of claim 2, wherein a first thickness of the first cathode is less than a second thickness of the second cathode; and
the first thickness of the first cathode is in a range from 50 Å to 100 Å, and the second thickness of the second cathode is in a range from 100 Å to 145 Å.

5. The display panel of claim 4, wherein the first thickness of the first cathode is in a range from 60 Å to 90 Å; and the second thickness of the second cathode is in a range from 110 Å to 130 Å.

6. The display panel of claim 1, wherein the first cathode contains aluminum and silver, and the second cathode contains magnesium and silver; and a third volume percentage of the aluminum in the first cathode is in a range from 2% to 12%, and a second volume percentage of the magnesium in the second cathode is in a range from 8% to 20%.

7. The display panel of claim 6, wherein the third volume percentage of the aluminum in the first cathode is in a range from 2% to 6%, and the second volume percentage of the magnesium in the second cathode is 10%.

8. The display panel of claim 6, wherein a first thickness of the first cathode is less than a second thickness of the second cathode; and
the first thickness of the first cathode is in a range from 40 Å to 100 Å; and the second thickness of the second cathode is in a range from 100 Å to 145 Å.

9. The display panel of claim 8, wherein the first thickness of the first cathode is in a range from 70 Å to 90 Å; and the second thickness of the second cathode is in a range from 110 Å to 130 Å.

10. The display panel of claim 1, wherein the first cathode contains magnesium, aluminum and silver, and the second cathode contains magnesium and silver; and
a first volume percentage of the magnesium in the first cathode is in a range from 5% to 10%; a third volume percentage of the aluminum in the first cathode is in a range from 1% to 6%; and a second volume percentage of the magnesium in the second cathode is in a range from 8% to 20%.

11. The display panel of claim 10, wherein the third volume percentage of the aluminum in the first cathode is in a range from 1% to 3%; and the second volume percentage of the magnesium in the second cathode is 10%.

12. The display panel of claim 1, further comprising a transition region disposed between the transparent display region and the non-transparent display region, wherein
the display panel further comprises a third cathode; the third cathode is in the transition region; and a material and a third thickness of the third cathode are identical to a material and a second thickness of the second cathode respectively.

13. The display panel of claim 1, further comprising a first anode and a second anode, wherein
the first anode is in the transparent display region; the second anode is in the non-transparent display region; the first anode is a light-transmitting anode; the second anode is a reflective anode; and the reflective anode comprises a light-transmitting layer and a reflective layer.

14. The display panel of claim 13, wherein a fourth work function of the light-transmitting anode ranges from 4.4 eV to 5 eV, and a fifth work function of the light-transmitting layer ranges from 4.4 eV to 5 eV.

15. The display panel of claim 13, wherein a reflectivity of the reflective anode ranges from 90% to 100%.

16. The display panel of claim 13, further comprising a transition region disposed between the transparent display region and the non-transparent display region, and a third cathode, wherein
the third cathode is in the transition region, and a material of the third cathode is identical to a material of the second cathode.

17. The display panel of claim 13, further comprising a first OLED light-emitting material layer and a second OLED light-emitting material layer, wherein
the first OLED light-emitting material layer is in the transparent display region, and the second OLED light-emitting material layer is in the non-transparent display region;
the first OLED light-emitting material layer is disposed between the first cathode and the first anode; and
the second OLED light-emitting material layer is disposed between the second cathode and the second anode.

18. The display panel of claim 16, further comprising a third OLED light-emitting material layer, wherein
the third OLED light-emitting material layer is in the transition region, and
the third OLED light-emitting material layer is disposed between the third cathode and a third anode.

19. A display device, comprising:
a device body having a device region; and
the display panel of claim 1, the display panel covering the device body;
wherein the device region is disposed under the transparent display region of the display panel, and a photosensitive device emitting or receiving light through the transparent display region is disposed in the device region.

20. The display panel of claim 1, further comprising a first anode, a second anode, a first OLED light-emitting material layer, and a second OLED light-emitting material layer, wherein
the first anode is in the transparent display region, and the second anode is in the non-transparent display region;
the first OLED light-emitting material layer is in the transparent display region, and the second OLED light-emitting material layer is in the non-transparent display region;
the first OLED light-emitting material layer is disposed between the first cathode and the first anode; and
the second OLED light-emitting material layer is disposed between the second cathode and the second anode.

\* \* \* \* \*